(12) United States Patent
Park et al.

(10) Patent No.: US 10,622,476 B2
(45) Date of Patent: Apr. 14, 2020

(54) VERTICAL FIELD EFFECT TRANSISTOR HAVING TWO-DIMENSIONAL CHANNEL STRUCTURE

(71) Applicant: Samsung Electronics Co., Ltd., Suwon-si, Gyeonggi-do (KR)

(72) Inventors: Yong Hee Park, Hwaseong-si (KR); Myung Gil Kang, Suwon-si (KR); Young-Seok Song, Hwaseong-si (KR); Keon Yong Cheon, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/128,995

(22) Filed: Sep. 12, 2018

(65) Prior Publication Data

US 2019/0198669 A1 Jun. 27, 2019

Related U.S. Application Data

(60) Provisional application No. 62/610,650, filed on Dec. 27, 2017.

(51) Int. Cl.

| *H01L 29/78* | (2006.01) |
|---|---|
| *H01L 29/10* | (2006.01) |
| *H01L 29/08* | (2006.01) |
| *H01L 29/06* | (2006.01) |
| *H01L 29/66* | (2006.01) |
| *H01L 27/12* | (2006.01) |

(52) U.S. Cl.
CPC ...... *H01L 29/7827* (2013.01); *H01L 29/0657* (2013.01); *H01L 29/0847* (2013.01); *H01L 29/1037* (2013.01); *H01L 29/66666* (2013.01); *H01L 27/1248* (2013.01)

(58) Field of Classification Search
CPC ............ H01L 29/7827; H01L 29/0847; H01L 29/1037
See application file for complete search history.

(56) References Cited

U.S. PATENT DOCUMENTS 5,563,077 A * 10/1996 Ha ................... H01L 29/66795
257/401
7,732,860 B2 6/2010 Parthasarathy
(Continued)

FOREIGN PATENT DOCUMENTS

KR 10-2017-0109422 A 9/2017

*Primary Examiner* — Sitaramarao S Yechuri
(74) *Attorney, Agent, or Firm* — Harness, Dickey and Pierce, P.L.C.

(57) ABSTRACT

A vertical field effect transistor (VFET) including a first source/drain region, a channel structure upwardly protruding from the first source/drain region and configured to serve as a channel, the channel structure having a two-dimensional structure in a plan view, the channel structure having an opening at at least one side thereof, the channel structure including one or two first portions and one or more second portions, the one or two first portion extending in a first direction, and the one or more second portions connected to corresponding one or more of the one or more first portions and extending in a second direction, the second direction being different from the first direction, a gate structure horizontally surrounding the channel structure, and a second source/drain region upwardly on the channel structure may be provided.

19 Claims, 15 Drawing Sheets

(56) References Cited

U.S. PATENT DOCUMENTS

| | | | |
|---|---|---|---|
| 8,072,027 B2 | 12/2011 | Kim et al. | |
| 8,482,041 B2 | 7/2013 | Masuoka et al. | |
| 8,637,849 B2 | 1/2014 | Deligianni et al. | |
| 9,425,296 B2 | 8/2016 | Li et al. | |
| 9,659,941 B2 | 5/2017 | Anderson et al. | |
| 2013/0229223 A1* | 9/2013 | Shrivastava | H01L 29/102 |
| | | | 327/438 |
| 2015/0380548 A1* | 12/2015 | Wang | H01L 29/7827 |
| | | | 257/329 |
| 2016/0027917 A1* | 1/2016 | Lin | H01L 29/0653 |
| | | | 257/329 |
| 2017/0271508 A1 | 9/2017 | Heo et al. | |
| 2017/0301776 A1* | 10/2017 | Zhang | H01L 29/66666 |
| 2017/0316945 A1 | 11/2017 | Anderson et al. | |
| 2017/0317177 A1 | 11/2017 | Mallela et al. | |

\* cited by examiner though this may be described as "below" the other elements or features. Thus, the exemplary term "above" may encompass both an above and below orientation.

VERTICAL FIELD EFFECT TRANSISTOR HAVING TWO-DIMENSIONAL CHANNEL STRUCTURE

CROSS-REFERENCE TO RELATED APPLICATION

This non-provisional application claims priority from U.S. Provisional Patent Application No. 62/610,650 filed on Dec. 27, 2017 in the U.S. Patent and Trademark Office, and all the benefits accruing therefrom under 35 U.S.C. 119, the contents of which are incorporated herein by reference in its entirety.

BACKGROUND

1. Field

Some example embodiments of the inventive concepts disclosed herein relate to vertical field effect transistors, and more particularly, to vertical field effect transistors (VFETs) having a two-dimensional (2D) channel structure.

2. Description of the Related Art

Due to enhanced scalability and lower middle-of-line (MOL) capacitance and/or a relatively lower contact resistance in the transistor structure, a VFET has been extensively studied as a promising one of viable candidates for fin field effect transistor (FinFET) alternatives and/or horizontal nanosheet field effect transistor (HNS FET) alternatives. Further, a VFET has a design freedom with regard to a channel length thereof. Thus, a VFET can be designed to be free from the so-called short channel effect.

FIG. 1 shows a conceptual perspective cutaway view of a VFET. Referring to FIG. 1, the VFET has a relatively short channel width compared to other devices (e.g., FinFET and HNS FET). For example, when a FinFET implementing an 1× inverter standard cell has a channel width of 300 nm, the VFET implementing the same 1× inverter standard cell may have a channel width of 220 nm. Thus, the VFET tends to have a relatively poor current drivability. Accordingly, VFET structures having a relatively wider channel width compared to the other device architectures (e.g., FinFET and HNS FET), and thus showing improved performance, are being desired.

SUMMARY

Some example embodiments of the inventive concepts provide vertical field effect transistors (VFETs) having increased effective channel widths.

Some example embodiments of the inventive concepts VFETs having two-dimensional (2D) channel structures.

Some example embodiments of the inventive concepts provide VFETs having improved electrical performances.

According to an example embodiment of the inventive concepts, a VFET may include a first source/drain region, a channel structure upwardly protruding from the first source/drain region and configured to serve as a channel, the channel structure having a two-dimensional structure in a plan view, the channel structure having an opening at at least one side thereof, the channel structure including one or two first portions and one or more second portions, the one or two first portion extending in a first direction, and the one or more second portions connected to corresponding one or more of the one or more first portions and extending in a second direction, the second direction being different from the first direction, a gate structure horizontally surrounding the channel structure, and a second source/drain region upwardly on the channel structure.

According to an example embodiment of the inventive concepts, a VFET may include a substrate including a first source/drain region, a channel structure protruding from the first source/drain region and configured to serve as a channel, the channel structure having a two-dimensional shape in a plan view, the channel structure having an opening at one side thereof, a gate structure horizontally surrounding the channel structure, and a second source/drain region on the channel structure.

According to an example embodiment of the inventive concepts, a VFET may include a substrate including a first source/drain region, a channel structure vertically protruding from the first source/drain region of the substrate and configured to serve as a channel, the channel structure having a two-dimensional structure in a plan view, the channel structure having an opening at at least one side thereof, the channel structure including two or more first portions extending in a first direction and at least one second portion connecting the two or more first portions, a gate structure horizontally surrounding the channel structure, and a second source/drain region on the channel structure, the second source/drain region facing the first source/drain region with the channel structure vertically interposed therebetween.

BRIEF DESCRIPTION OF THE DRAWINGS

The above and other features and advantages of the present invention will become more apparent by describing in detail some example embodiments thereof with reference to the attached drawings in which.

DETAILED DESCRIPTION

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof. (Expressions such as "at least one of," when preceding a list of elements, modify the entire list of elements and do not modify the individual elements of the list.)

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, some example embodiments of the present inventive concepts will be explained with reference to the accompanying drawings.

Figure 1:
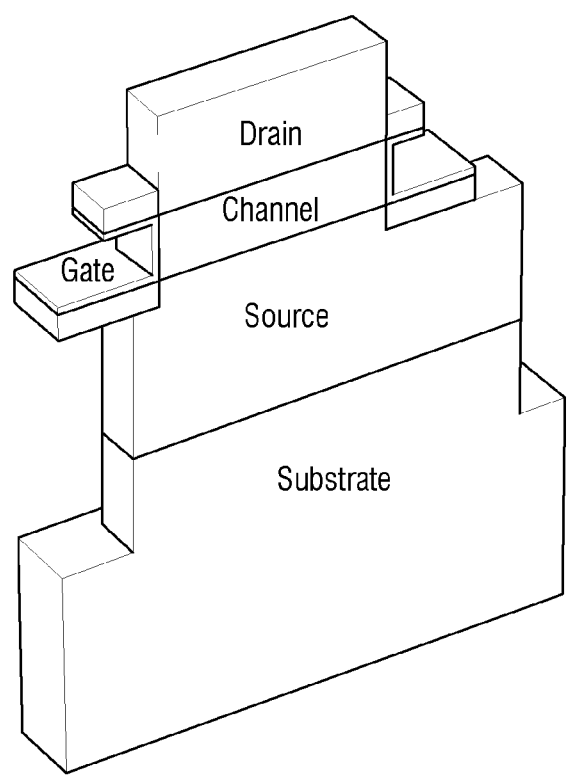
FIG. 1 shows a conceptual perspective cutaway view of a vertical field effect transistor (VFET)
Figure 2A:
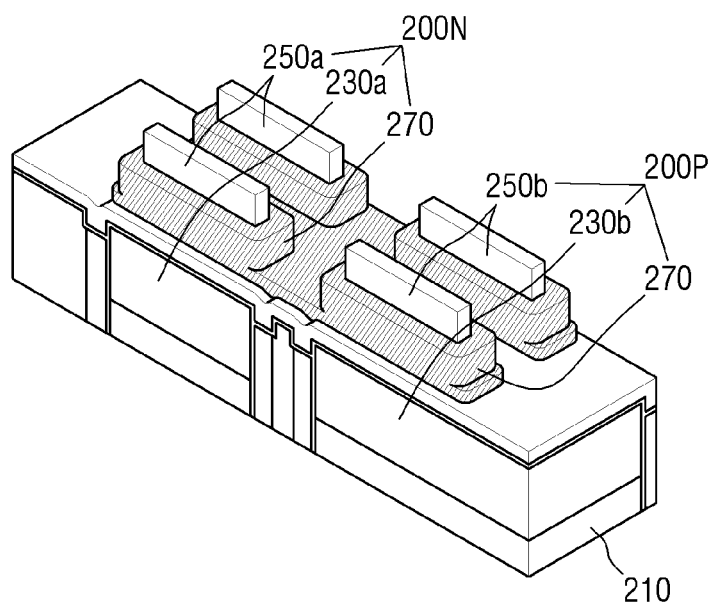
FIG. 2A is a perspective view of an 1× inverter standard cell implemented by VFETs, according to a conventional art.
Figure 2B:
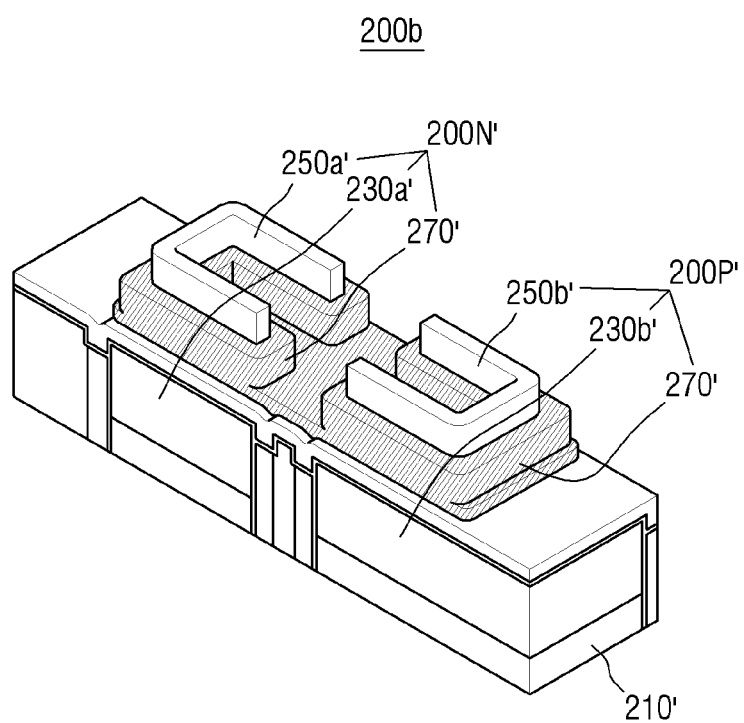
FIG. 2B is a perspective view of an 1× inverter standard cell implemented by VFETs, according to an example embodiment of the inventive concepts.

FIG. 2A is a perspective view of an 1× inverter standard cell implemented by vertical field effect transistors (VFETs), according to a conventional art. FIG. 2B is a perspective view of an 1× inverter standard cell implemented by VFETs, according to an example embodiment of the inventive concepts.

Referring to FIG. 2A, an 1× inverter standard cell 200a according to the conventional art includes a NMOS VFET 200N and a PMOS VFET 200P. The NMOS VFET 200N includes a first source/drain region 230a, a channel structure 250a, and a gate structure 270. A gate insulating layer and a second source/drain region of the NMOS VFET 200N are not specifically illustrated for conveniences of explanation. The PMOS VFET 200P includes a first source/drain region 230b, a channel structure 250b, and the gate structure 270. A gate insulating layer and a second source/drain region of the PMOS VFET 200P are not specifically illustrated for conveniences of explanation. The first source/drain regions 230a and 230b may be formed in a semiconductor substrate 210. In some cases, each of the first source/drain regions 230a and 230b may be provided at a bottom portion of a fin protruding from the semiconductor substrate 210. The channel structures 250a and 250b may be provided by fins protruding from the semiconductor substrate 10. For convenience of explanation, each of the channel structures 250a and 250b will be interchangeably referred to as a fin.

The substrate 210 may be a portion of a bulk silicon wafer. The substrate 210 may be a silicon portion of a Silicon-On-Insulator (SOI) wafer. The substrate 210 may include a material other than silicon, including but not limited to Ge, SiGe, SiC, GeP, GeN, InGaAs, GaAs, InSb, InAs, GaSb, and InP. The substrate 210 may refer to a semiconductor layer epitaxially grown on a base substrate.

Referring to FIG. 2A, the first source/drain regions 230a and 230b are provided in the substrate 210. The first source/drain region 230a may be doped with an n-type of impurities (e.g., phosphorous P or arsenic As) and serves as a source or a drain of the NMOS VFET 200N. The first source/drain region 230b may be doped with a p-type (e.g., boron B) of impurities and serves as a source or a drain of the PMOS VFET 200N.

Second source/drain regions (not shown) of the NMOS VFET 200N and PMOS VFET 200P may be provided at an upper portion of the fin structure 250a and 250b, respectively, or may be separately provided on the channel structures 250a and 250b. For example, the second source/drain regions may be epitaxially-grown on the channel structures 250a and 250b. In some examples, the first source/drain regions 230a and 230b may function as source regions, and the second source/drain regions (not shown) may function as drain regions. In some other examples, the first source/drain regions 230a and 230b may function as drain regions, and the second source/drain regions (not shown) may function as source regions.

As illustrated, each of the fins constituting a channel structure of a VFET (e.g., 200N or 200P) are arranged one dimensionally in a plan view. In other words, each of the fins constituting a channel structure of a VFET (e.g., 200N or 200P) has a line shape elongated in a direction. Further, the two fins constituting a channel region of a VFET are spaced apart from each other. The conventional are has been illustrated with an example, in which each of the VFET includes a channel structure made of two fins. However, examples of the conventional art are not limited thereto. In some other examples of the conventional art, a channel structure of the VFET may include more than two fins (e.g., three fins).

Referring to FIG. 2B, a 1× inverter standard cell 200b according to an example embodiment of the inventive concepts includes a NMOS VFET 200N' and a PMOS VFET 200P'. The NMOS VFET 200N' includes a first source/drain region 230a', a channel structure 250a', and a gate structure 270'. A gate insulating layer and a second source/drain region of the NMOS VFET 200N' are not specifically illustrated for conveniences of illustration. The PMOS VFET 200P' includes a first source/drain region 230b', a channel structure 250b', and the gate structure 270'. A gate insulating layer and a second source/drain region of the PMOS VFET 200P' are not specifically illustrated for conveniences of illustration.

Like the substrate 210 in FIG. 2A, the substrate 210' may be a portion of a bulk silicon wafer. The substrate 210' may be a silicon portion of a Silicon-On-Insulator (SOI) wafer. The substrate 210' may include a material other than silicon, including but not limited to Ge, SiGe, SiC, GeP, GeN, InGaAs, GaAs, InSb, InAs, GaSb, and InP. The substrate 210' may refer to a semiconductor layer epitaxially grown on a base substrate.

The first source/drain regions 230a' and 230b' may be formed in a semiconductor substrate 210'. In some cases, each of the first source/drain regions 230a' and 230b' may be provided at a bottom portion of a fin protruding from the semiconductor substrate 210'. According to some example embodiments, each of the first source drain regions 230a' and 230b' may be formed at a bottom portion of a fin, which protrudes from the semiconductor substrate 210'. The first source/drain region 230a' may be doped with an n-type of impurities (e.g., phosphorous P or arsenic As) and serves as a source or a drain of the NMOS VFET 200N'. The first source/drain region 230b' may be doped with a p-type (e.g., boron B) of impurities and serves as a source or a drain of the PMOS VFET 200N'.

Each of the second source/drain region (not shown) of the NMOS VFET 200N' and the second source/drain region (not shown) of the PMOS VFET 200P' may be provided at an upper portion of a fin protruding from the substrate 210'. In some example embodiments of the inventive concepts, the second source/drain region (not shown) of the NMOS VFET 200N' and the second source/drain region (not shown) of the PMOS VFET 200P' may be separately provided on the channel structures (e.g., fins) 250a' and 250b'. In some examples, the first source/drain regions 230a' and 230b' may function as source regions, and the second source/drain regions (not shown) may function as drain regions. In some other examples, the first source/drain regions 230a' and 230b' may function as drain regions, and the second source/drain regions (not shown) may function as source regions.

The second source/drain region (not shown) of the NMOS VFET 200N' and the second source/drain region (not shown) of the PMOS VFET 200P' may vertically protrude above the gate structure 270'.

The gate structures 270' may horizontally surround the channel structures 250a' and 250b', respectively.

Each of the channel structures 250a' and 250b' may be provided by a fin protruding from the semiconductor substrate 210'. Thus, for convenience of explanation, each of the channel structures 250a and 250b will be interchangeably referred to as a fin. Referring to FIG. 2B, the channel structure (e.g., 250a' or 250b') of a VFET (e.g., 200N' or 200P') is provided by a fin, which protrudes upwardly from the first source/drain region (e.g., 230a' or 230b'), and has a two-dimensional (2D) shape in a plan view. Further, the 2D shape of the channel structure has an opening at at least one side thereof. The channel structure (e.g., 250a' or 250b') may include (1) one or two first portions extending in a first direction and (2) one or more second portions connected to corresponding one or more of the one or more first portions and extending in a second direction different from the first direction. For example, the channel structure may have a Π shape.

For example, the channel structure (270a' or 270b') illustrated FIG. 2B may result in a 25% greater effective channel width $W_{eff}$ compared with the one-dimensional (1D) channel structure (270a and 270b) illustrated FIG. 2A, as summarized in table 1 below.

TABLE 1

| | VFET of FIG. 2A | VFET of FIG. 2B |
|---|---|---|
| Fin Pitch (nm) | 40 | 40 |
| Fin Width (nm) | 6 | 6 |
| Fin Shape | ǀ ǀ (1D) | Π (2D) |
| $W_{length}$ (nm) | 50/50 | 50/34/50 |
| $W_{eff}$ (nm) | (50 + 50 + 6 + 6) × 2 = 224 | (50 + 44 + 6 + 6) × 2 + 34 × 2 = 280 |

Table 1 assumes a case where a pitch between pins is 40 nm and a width of a pin is 6 nm.

Under this design rule, each of the channel structures (or fin) 270a and 270b of FIG. 2A is horizontally surrounded by the gate structure 270. Thus, an effective channel width of one fin is 50+50+6+6=12 nm. Thus, the total effective channel width $W_{eff}$ achieved by the two 1D channel structure of FIG. 2A is 112×2=224 nm.

Under the same design rule, the channel structure 270a' or 270b' of FIG. 2B has a two-dimensional structure in a plan view, and is horizontally surrounded by the gate structure 270'. The channel structure (or fin) 270a' or 270b' of FIG. 2B corresponds to a structure in which two 1D fin portions of FIG. 2A are connected to each other by a connecting fin portion. Thus, an effective channel width of each of the two 1D fin portions fin is 50+44+6+6=212 nm, and an effective channel width of the connection fin portion is 34×2=68 nm. Thus, the total effective channel width $W_{eff}$ achieved by the two 1D channel structure of FIG. 2B is 212+68=280 nm. Due to the larger effective channel width, the VFET having the two-dimensional channel structure as illustrated in FIG. 2B may exhibit improved AC and/or DC electrical characteristics compared with the VFET having the 1D channel structure as illustrated in FIG. 2A.

Referring to FIGS. 2A and 2B, the VFET of FIG. 2B (e.g., a VFET having a Π shaped 2D channel structure) has about 25% greater channel effective width than the VFET of FIG. 2A (e.g., a VFET having a 1D channel structure). Thus, the VFET of FIG. 2B exhibit improved DC electrical characteristics (e.g., current drivability) than the VFET of FIG. 2A. For example, an NMOS VFET having the 2D channel structure of FIG. 2B has 25% greater current drivability than an NMOS VFET having the 1D channel structure of FIG. 2A, and a PMOS VFET having the 2D channel structure of FIG. 2B has 19% greater current drivability than a PMOS VFET having the 1D channel structure of FIG. 2A. The VFET having a 2D channel structure as illustrated in FIG. 2B may also exhibit improved AC performances compared to the VFET having a 1D channel structure as illustrated in FIG. 2A. AC performance improvements of the VFET having a 2D channel structure will be described below in connection with FIG. 5.

Although FIG. 2B shows the channel structures 250a' and 250b' having a Π shape, example embodiments of the inventive concepts are not limited thereto. The channel structure may have any shapes as long as the shape has a two-dimensional shape in a plan view, and has an opening at one side thereof.

Figure 3:
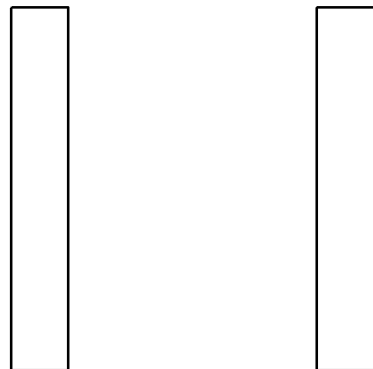
FIG. 3 is a plan view of a one-dimensional (1D) channel structure of the VFET of FIG. 2A.

FIG. 3 is a plan view of a 1D channel structure of the VFET of FIG. 2A. In this disclosure, the 1D channel structure refers to a channel structure, each portions of which are one-dimensionally arranged (e.g., arranged in a line shape) in a plan view. Referring to FIG. 3, the 1D channel structure includes two fins protruding from a substrate and each arranged in a direction with a straight line shape. A VFET adopting such a 1D channel structure has a relatively poor current drivability compared to, for example, fin field effect transistor (FinFET) alternatives and/or horizontal nanosheet field effect transistor (HNS FET) alternatives.

Figure 4A:
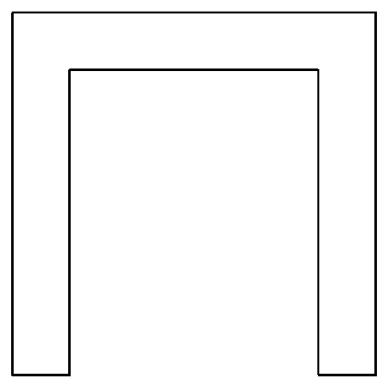
FIGS. 4A-4E are plan views of examples of two-dimensional (2D) channel structures of VFETs, according to some example embodiments of the inventive concepts.
Figure 4B:
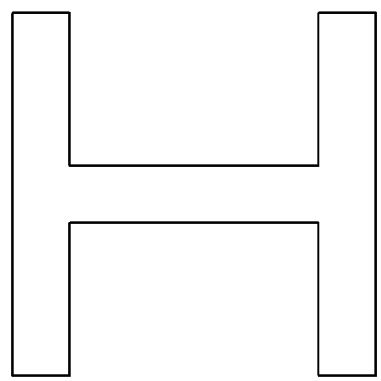
Figure 4C:
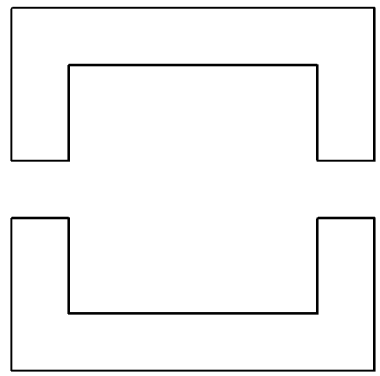
Figure 4D:
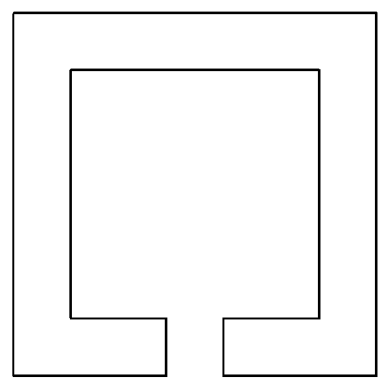
Figure 4E:
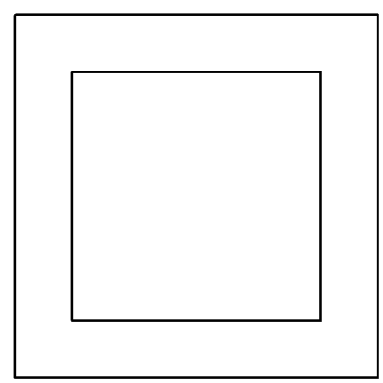

FIGS. 4A-4E are plan views of examples of two-dimensional (2D) channel structures of VTETs, according to some example embodiments of the inventive concepts. In this disclosure, the 2D channel structure refers to a channel structure having a 2D shape in a plan view. FIG. 4A illustrates an example of the 2D channel structure (e.g., Π shape) of the VFET of FIG. 2B; FIG. 4B illustrates an example in which the 2D channel structure has a H shape; FIG. 4C illustrates an example in which the 2D channel structure has a [ ] shape; FIG. 4D illustrates an example in which the 2D channel structure has a modified Π shape (or a □ shape with an opening through a portion of one side thereof); and FIG. 4E illustrates an example in which the 2D channel structure has a □ shape.

A VFET adopting one of the 2D channel structures illustrated in FIGS. 4A-4E may have a relatively wide channel width compared with the 1D channel structure as illustrated in FIG. 3, and thus may exhibit improved current drivability than the VFET adopting the 1D channel structure.

According to some example embodiments (e.g., FIGS. 4A through 4D) of the inventive concepts, the 2D channel structure may include an opening at one side thereof, and may include a first portion extending in a first direction and at least one second portion connected to the first portion and extending in a second direction, which is different from the first direction. FIGS. 4A through 4D show 2D channel structures having a Π shape, a H shape, a [ ] shape, and a modified Π shape, respectively. However, example embodiments of the inventive concepts are not limited thereto. In some example embodiments, a channel structure may have an X shape, a Z shape, a ⊐ shape, or a E shape. The ⊐ shape and the E shape may be considered as modified examples of the Π shape.

According to some example embodiments, the 2D shape of each of the channel structures 250a' and 250b' having an opening at one side thereof may include two or more first portions extending in a first direction and at least one second portion connecting the two or more first portions. The number of the two or more first portions may be two, and the number of the at least one second portion may be one. For example, the channel structures 250a' and 250b' may have a Π shape. The number of the two or more first portions may be three, and the number of the at least one second portion may be one. For example, the channel structures 250a' and 250b' may have a E shape. The number of the two or more first portions may be three, and the number of the at least one second portion may be two. For example, the channel structures 250a' and 250b' may have a ⊐ shape.

FIG. 4E illustrate the 2D channel structure having a □ shape, as an example 2D channel structure having a closed shape (e.g., not having an opening at a side thereof). In this case, a gate structure may have a first portion horizontally covering an interior of the channel structure and a second portion horizontally covering an exterior of the channel structure. Thus, a gate voltage may only be able to be applied to the second portion of the gate structure and may not be able to be applied to a first portion of a gate structure. This is because the channel structure does not have an opening at one side of its 2D structure, and thus the first and second portions of the gate structure are physically separated from each other.

Figure 5:
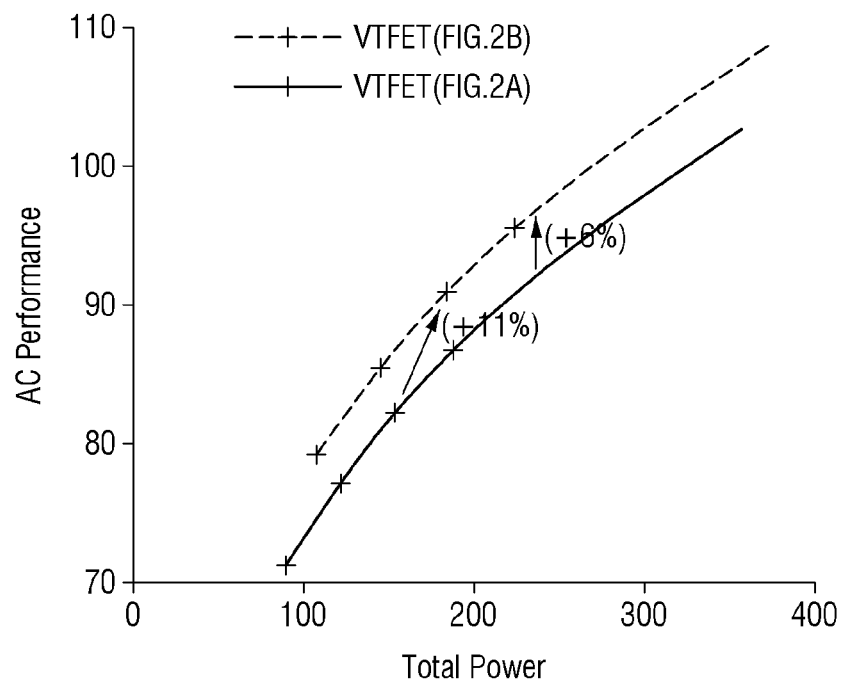
FIG. 5 is a graph showing AC performance comparison results between a VFET having a 1D channel structure as illustrated in FIGS. 2A and 3 and a VFET having a 2D channel structure as illustrated in FIGS. 2B and 4.

FIG. 5 is a graph showing AC performance comparison results between a VFET having a 1D channel structure as illustrated in FIGS. 2A and 3 and a VFET having a 2D channel structure as illustrated in FIGS. 2B and 4. Referring to FIG. 5, the VFET of FIGS. 2B and 4A (an example having a 2D channel structure) exhibits about 6% performance improvement in terms of AC performances with respect to the comparable VFET of FIGS. 2A and 3 (an example having a 1D channel structure). At a same Vdd data points, the VFET of FIG. 2B exhibits about 11% performance improvement in terms of AC performances with respect to the comparable VFET of FIG. 2A. The VFET having the 2D channel structure of FIGS. 2B and 4A may also exhibit improved DC electrical characteristics compared to the VFET having the 1D channel structure of FIGS. 2A and 3, as described above in connection with FIGS. 2A and 2B.

According to some example embodiments of the present disclosure, a VFET may be provided with a channel structure having an increased effective width. Accordingly, the VFET having improved DC electrical characteristics (e.g., current drivability) may be obtained.

According to some example embodiments of the present disclosure, a VFET may be provided with a 2D channel structure having an opening at one side thereof, and a gate structure horizontally surrounding the channel structure. Thus, a first portion of the gate structure covering interior of the 2D channel structure is connected to a second portion of the gate structure covering an exterior of the 2D channel structure. Accordingly, a gate voltage can be applied to both the first portion of the gate structure and the second portion of the gate structure.

FIGS. 6A, 6B, 6C, 6D, 6E, 6F, 6G, 6H, and 6I are perspective views to explain a method of forming the channel structure of FIG. 2B, according to an example embodiment of the inventive concepts.

Figure 6A:
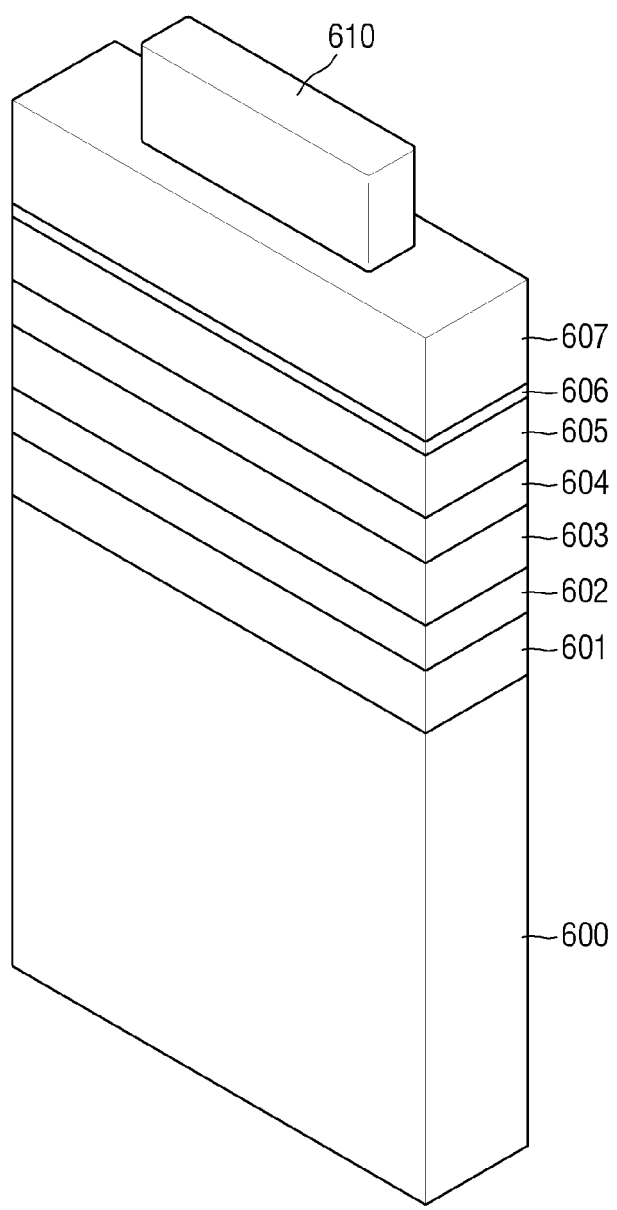
FIGS. 6A, 6B, 6C, 6D, 6E, 6F, 6G, 6H, and 6I are perspective views to explain a method of forming the channel structure of FIG. 2B, according to an example embodiment of the inventive concepts.

Referring to FIG. 6A, a stack of insulating layers may be deposited on a semiconductor substrate 600. The semiconductor substrate 600 may be a portion of a bulk silicon wafer. The semiconductor substrate 600 may be a silicon portion of a Silicon-On-Insulator (SOI) wafer. The semiconductor substrate 600 may include a material other than silicon, including but not limited to Ge, SiGe, SiC, GeP, GeN, InGaAs, GaAs, InSb, InAs, GaSb, and InP. The semiconductor substrate 600 may refer to a semiconductor layer epitaxially grown on a base substrate.

The stack of insulating layers may include a first insulating layer 601, a second insulating layer 602, a third insulating layer 603, a fourth insulating layer 604, a fifth insulating layer 605, a sixth insulating layer 606, and a seventh insulating layer 607. The first, third, and sixth insulating layers 601, 603, and 606 may include a same material or materials having comparable etch selectivities to each other. In some example embodiments, the second and fourth insulating layers 602 and 604 may include an oxide material (e.g., $SiO_2$) or a silicon carbide material and have comparable etch selectivities to each other.

A mandrel mask pattern 610 may be formed on the seventh insulating layer 607 (interchangeably referred to as a mandrel layer). The mandrel mask pattern 610 may be formed by using a photolithography process (e.g., Extreme UV photolithography process). The mandrel mask pattern 610 may include a photo-resistive material.

The seventh insulating layer 607 may have a high etch selectivity to the underlying sixth insulating layer 606. In some example embodiments, the fifth insulating layer 605 may include a hard mask material (e.g., silsesquioxane material or silanol material), the sixth insulating layer 606 may include nitride, and the seventh insulating layer 607 may include an organic layer made of Spin-on Organic Hard-mask (SOH) material. The SOH material may be Si-based material or carbon-based material.

Figure 6B:
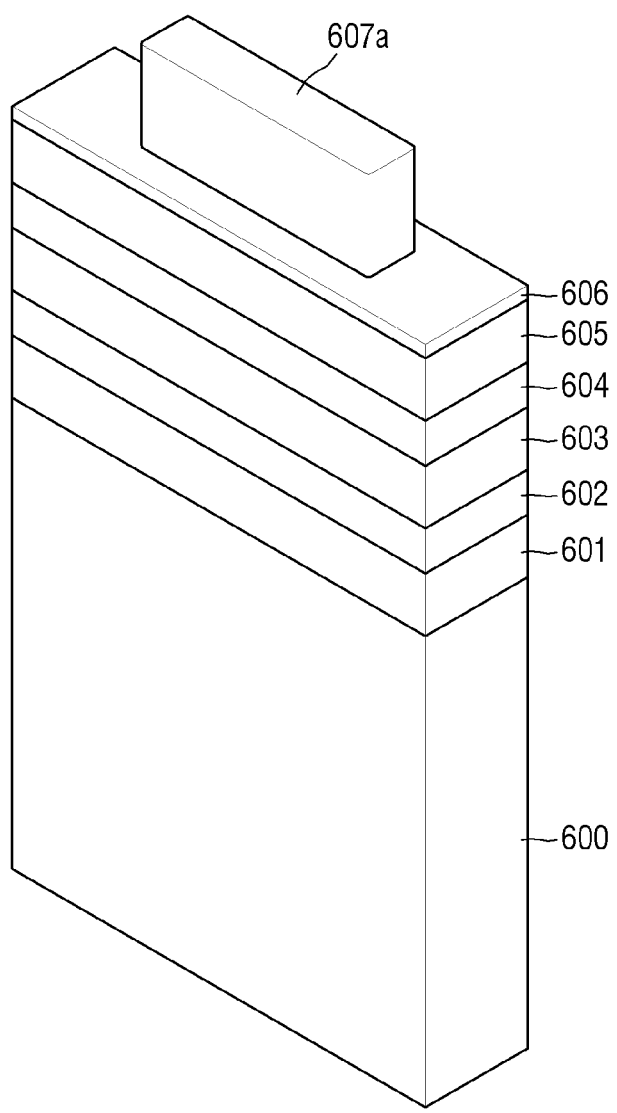

Referring to FIG. 6B, the seventh insulating layer 610 may be etched using the mandrel mask pattern 610 as a mask to form a mandrel 607a. The etching may be performed by using, for example, a reactive ion etching. After removing the mandrel mask pattern 610 by using, for example, an ashing process, the mandrel 607a may remain on the sixth insulating layer 606.

Figure 6C:
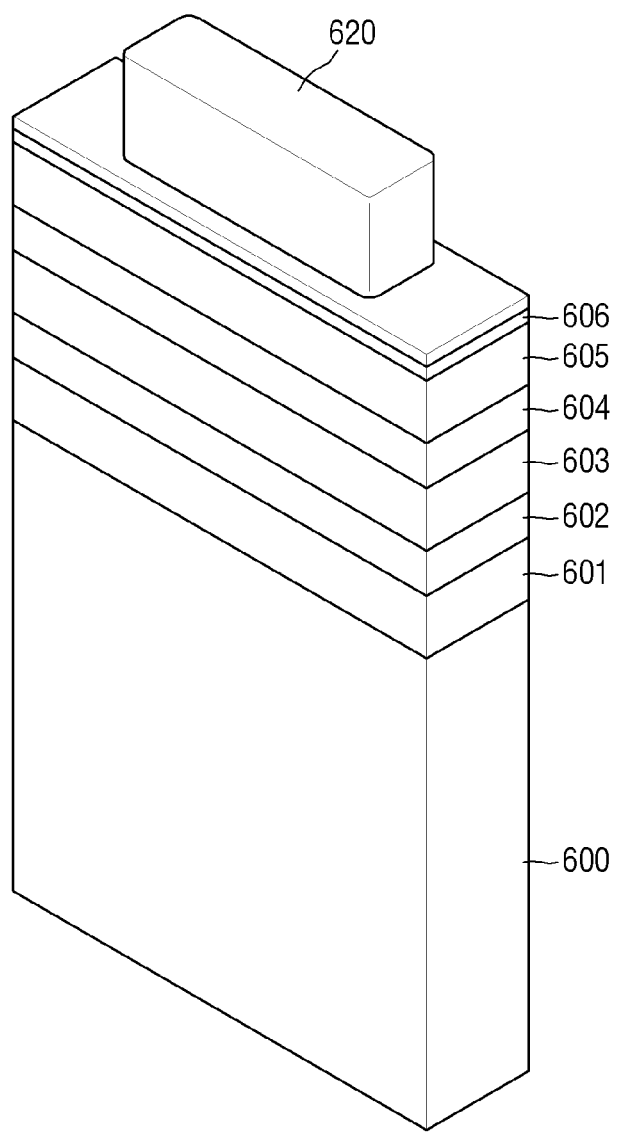

Referring to FIG. 6C, a spacer layer 620 may be conformally formed on the mandrel 607a and the fifth insulating layer 605 by using a chemical vapor deposition or an atomic layer deposition process. The spacer layer 620 may include a silicon nitride material or a silicon oxide material.

Figure 6D:
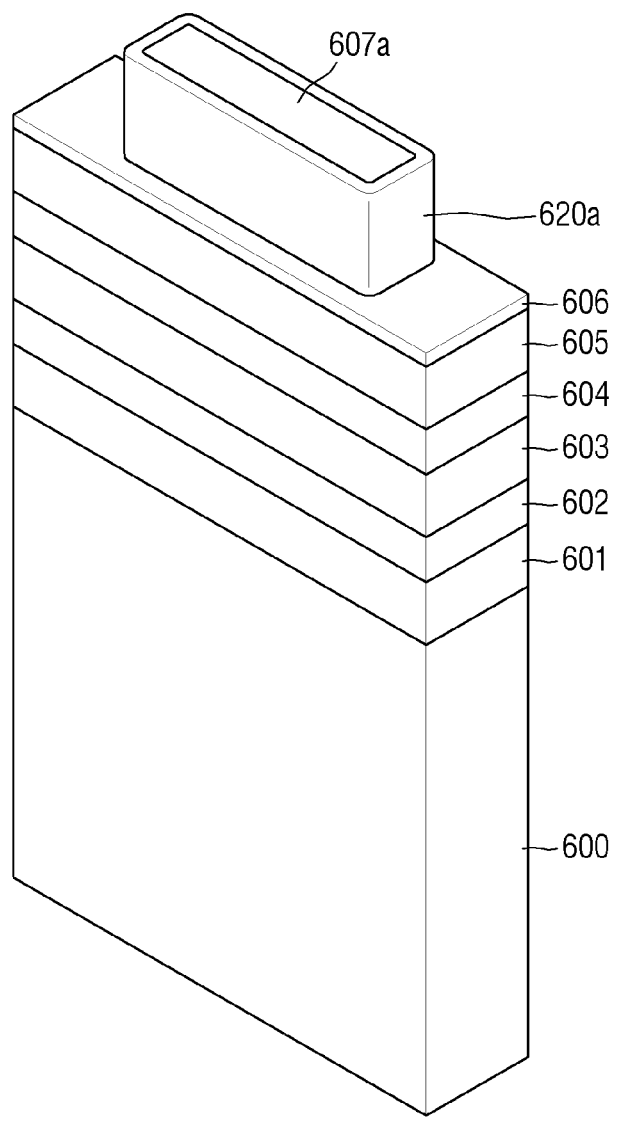

Then, the spacer layer 620 may be etched to leave a spacer 620a around the mandrel 607a, as illustrated in FIG. 6D.

Figure 6E:
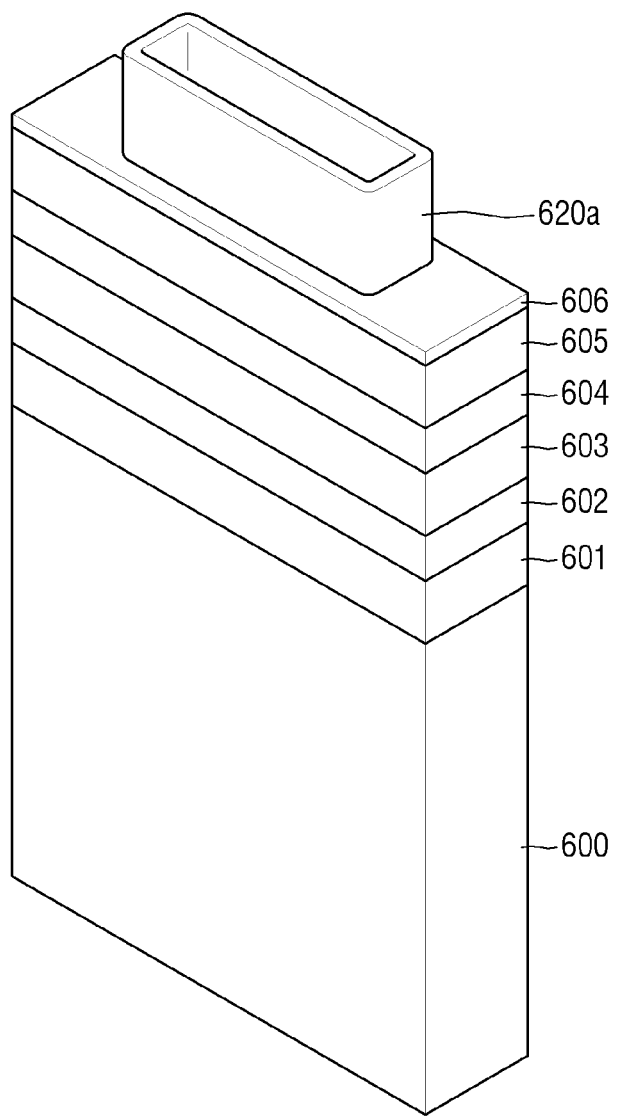

Referring to FIG. 6E, the mandrel 607a may be removed by using, for example, a wet etching, which is capable of selectively removing the mandrel 607a while leaving the spacer 620a on the fifth insulating layer 605.

Although not specifically illustrated with a separate drawing, the fifth insulating layer 605 and the sixth insulating layer 606 may be etched using the spacer 620a as a mask to form a hard mask pattern. Then, the second, third, and fourth insulating layers 602, 603, and 604 may be etched by using the hard mask pattern as a mask.

Figure 6F:
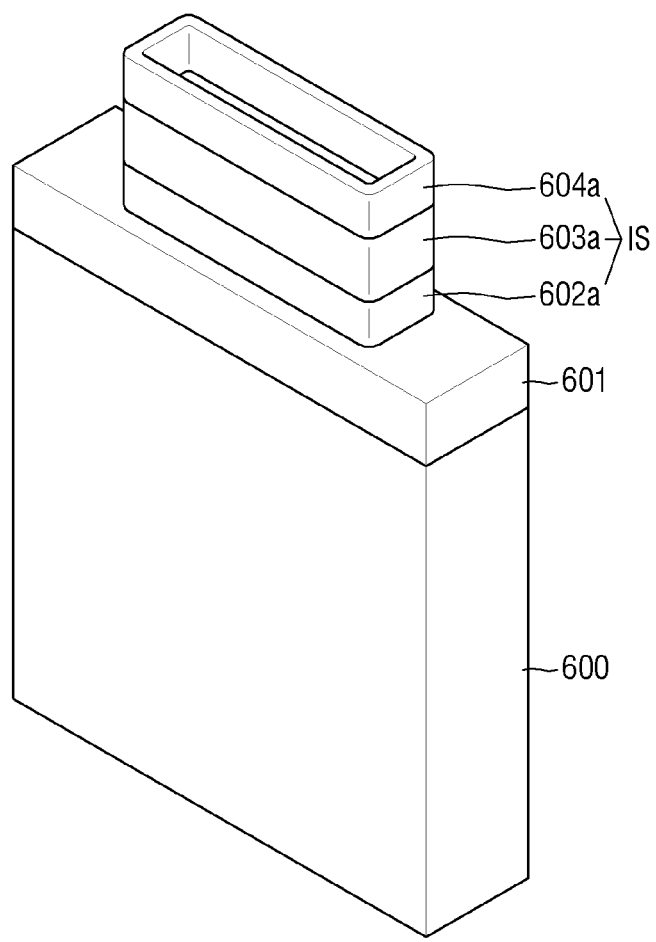

Subsequently, the hard mask pattern may be removed to leave an intermediate structure IS including the second insulating layer pattern 602a, third insulating layer pattern 603a, and fourth insulating layer pattern 604a, as shown in FIG. 6F.

Thereafter, a fin cut mask layer may be formed on the intermediate structure IS including the second insulating layer pattern 602a, third insulating layer pattern 603a, and fourth insulating layer pattern 604a. In some example embodiments, the fin cut mask layer may include a first mask layer and a second mask layer. Further, the first mask layer 630a may be deposited such that the top surface of the first mask layer is higher than the top surface of the intermediate pattern IS, and then the first mask layer may be planarized (e.g., etched-back) for ease of the following photolithography process. The second mask layer may be deposited on the first mask layer.

Figure 6G:
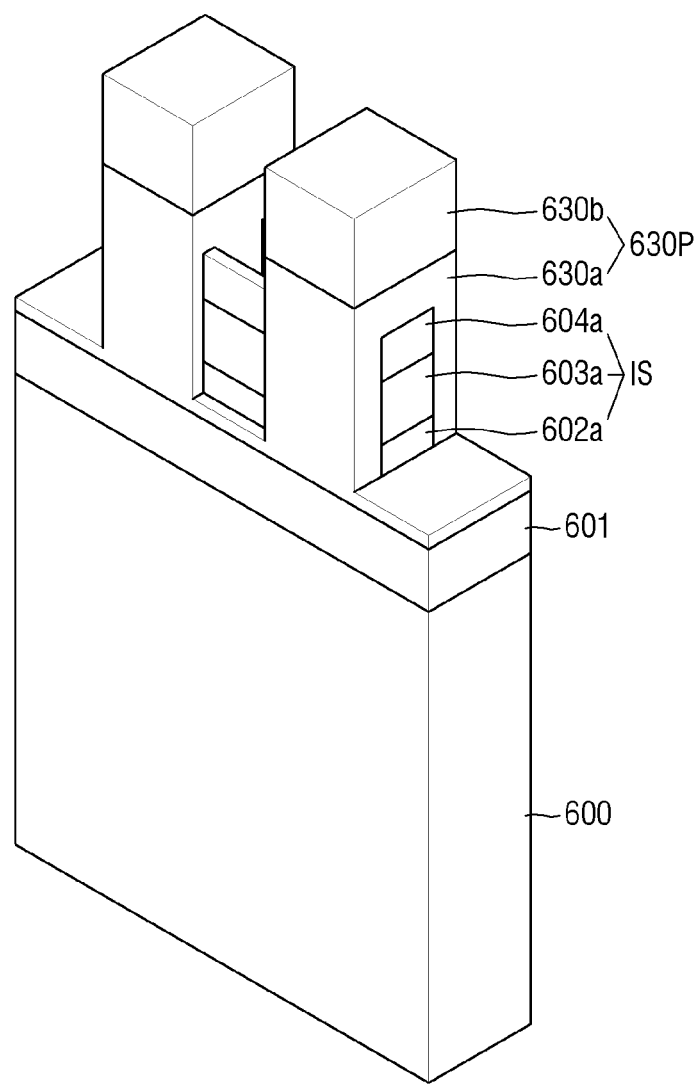

Referring to FIG. 6G, the fin cut mask layer (e.g., a stack of the first mask layer and the second mask layer) may be patterned to form a fin cut mask pattern 630p (e.g., a stack of the first mask pattern 630a' and the second mask pattern 630b'). The fin cut mask pattern 630p may have an opening at an area at which an underlying fin structure is exposed and to be cut.

Figure 6H:
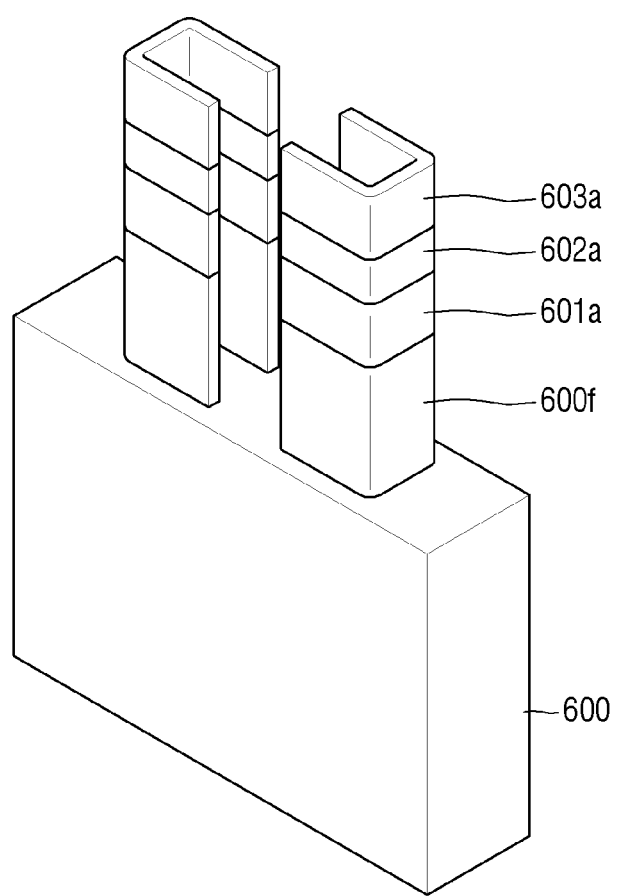

Referring to FIG. 6H, the first, second, third, and forth insulating layers 601, 602, and 603 may be etched using the fin cut mask pattern 630p as a mask to form a stacked pattern including the first, second, third, and forth insulating layer patterns 601a, 602a, and 603a. During this process, the semiconductor substrate 600 also may be etched to a certain depth to form fin structures 600f, which protrude from the semiconductor substrate 600 and are separated from each other.

Once the insulating layers (e.g., the first, second, third, and/or fourth insulating layers 601, 602, 603, and 604) on the fin structures 600f are removed, the semiconductor substrate 600 having the fin structures 600f, which has a 2D shape as the channel structure illustrated in FIG. 2B or 4A, may be formed.

Figure 6I:
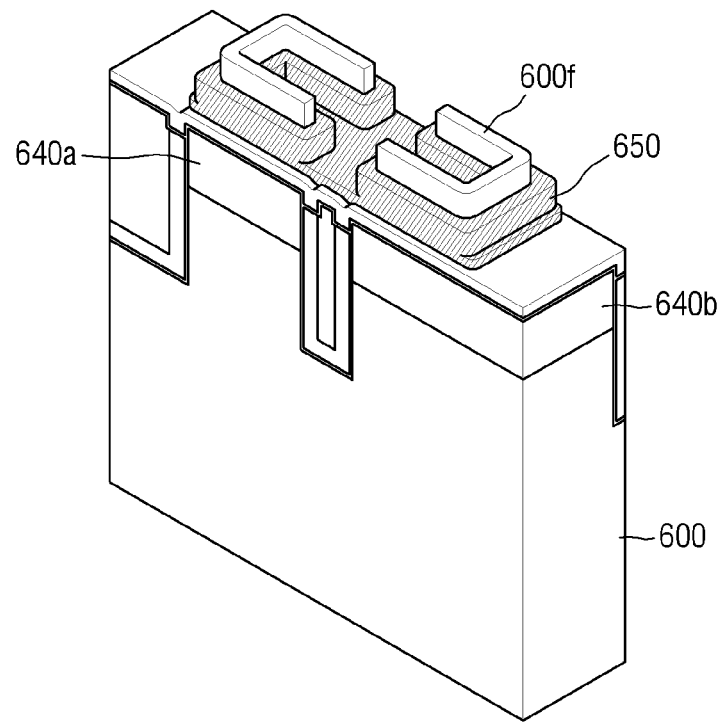

Then, bottom source/drain regions 640a and 640b and a gate structure 650 may be formed as illustrated in FIG. 6I.

In some example embodiments, the bottom source/drain regions 640a and 640b may be formed (1) by using an ion implantation, or (2) by etching the semiconductor substrate 600 to form a recess and epitaxially growing a doped semiconductor structure to fill the recess. A gate structure 650 may be formed to surround the fin structures 600f in a plan view.

Although not specifically illustrated with a separate drawing(s), to complete manufacturing of the VFETs, top source/drain regions may be formed on the fin structures 600f or at top portions of the fin structures 600f, respectively. The top source/drain regions may be epitaxial grown on the fin structures 600f, respectively, or may be formed by introducing impurities (e.g., n type conductivity impurities or p type conductivity impurities) on the top portions of the fin structures 699f, respectively.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims.

What is claimed is:

1. A vertical field effect transistor (VFET) comprising:
   a first source/drain region;
   a channel structure upwardly protruding from the first source/drain region and configured to serve as a channel, the channel structure having a two-dimensional structure in a plan view, the channel structure having an opening at at least one side thereof, the channel structure including one or two first portions and one or more second portions, the one or two first portion extending in a first direction, and the one or more second portions connected to corresponding one or more of the one or two first portions and extending in a second direction, the second direction being different from the first direction;
   a gate structure horizontally surrounding the channel structure in a completely enclosing manner in a plan view; and
   a second source/drain region upwardly on the channel structure.

2. The VFET of claim 1, wherein the second source/drain region and the channel structure are provided in a fin structure, the fin structure being a protruded portion of a substrate.

3. The VFET of claim 2, wherein the first source/drain region is provided in the substrate.

4. The VFET of claim 2, wherein the first source/drain region is provided in the fin structure.

5. The VFET of claim 1, wherein the second source/drain region vertically protrudes above the gate structure.

6. The VFET of claim 1, wherein the channel structure has at least one of a Π shape, a H shape, a [ ] shape, an X shape or a Z shape.

7. A vertical field effect transistor (VFET) comprising:
   a substrate including a first source/drain region;
   a channel structure protruding from the first source/drain region and configured to serve as a channel, the channel structure having a two-dimensional shape in a plan view, the channel structure having an opening at at least one side thereof;
   a gate structure horizontally surrounding the channel structure in a completely enclosing manner in a plan view; and
   a second source/drain region on the channel structure.

8. The VFET of claim 7, wherein the channel structure is provided in a fin structure, the fin structure being a protruded portion of the substrate.

9. The VFET of claim 8, wherein the second source/drain region is provided in the fin structure.

10. The VFET of claim 7, wherein the second source/drain region vertically protrudes above the gate structure.

11. The VFET of claim 7, wherein the channel structure includes a first portion extending in a first direction, and at least one second portion connected to the first portion and extending in a second direction, the second direction being different from the first direction.

12. A vertical field effect transistor (VFET) comprising:
   a first source/drain region included in a substrate;
   a channel structure vertically protruding from the first source/drain region of the substrate and configured to serve as a channel, the channel structure having a two-dimensional structure in a plan view, the channel structure having an opening at at least one side thereof, the channel structure including two or more first portions extending in a first direction and at least one second portion connecting the two or more first portions;
   a gate structure horizontally surrounding the channel structure in a completely enclosing manner in a plan view; and
   a second source/drain region on the channel structure, the second source/drain region facing the first source/drain region with the channel structure vertically interposed therebetween.

13. The VFET of claim 12, wherein the channel structure is provided in a fin structure, the fin structure being a protruded portion of the substrate.

14. The VFET of claim 13, wherein the second source/drain region is provided in the fin structure.

15. The VFET of claim 12, wherein the second source/drain region vertically protrudes above the gate structure.

16. The VFET of claim 12, wherein a number of the two or more first portions is two, and a number of the at least one second portion is one.

17. The VFET of claim 12, wherein a number of the two or more first portions is three, and a number of the at least one second portion is one.

18. The VFET of claim 12, wherein a number of the two or more first portions is three, and a number of the at least one second portion is two.

19. The VFET of claim 12, wherein the channel structure has at least one of a Π shape, a H shape, a E shape, or a ≡ shape.

* * * * *